(12) United States Patent
Chen et al.

(10) Patent No.: US 9,176,862 B2
(45) Date of Patent: Nov. 3, 2015

(54) SLC-MLC WEAR BALANCING

(75) Inventors: Jian Chen, Menlo Park, CA (US);
Sergey Anatolievich Gorobets,
Edinburgh (GB); Steven Sprouse, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 56 days.

(21) Appl. No.: 13/340,446

(22) Filed: Dec. 29, 2011

(65) Prior Publication Data

US 2013/0173844 A1  Jul. 4, 2013

(51) Int. Cl.
*G06F 12/00* (2006.01)
*G06F 12/02* (2006.01)
*G11C 16/34* (2006.01)

(52) U.S. Cl.
CPC .......... *G06F 12/0246* (2013.01); *G11C 16/349* (2013.01); *G06F 2212/7202* (2013.01); *G06F 2212/7211* (2013.01); *G11C 2211/5641* (2013.01)

(58) Field of Classification Search
CPC ................ G06F 2212/7206; G06F 2212/1668; G06F 2212/7205; G06F 2212/7209; G06F 12/0246; G06F 11/008; G06F 13/1694
USPC .......... 711/103, E12.008, E12.001, 156, 154, 711/167, E12.078, E12.103, 151
See application file for complete search history.

(56) References Cited

U.S. PATENT DOCUMENTS

| | | | |
|---|---|---|---|
| 7,797,481 B2 | 9/2010 | Lee et al. | |
| 8,281,061 B2 * | 10/2012 | Radke et al. | 711/103 |
| 2008/0215800 A1 | 9/2008 | Lee et al. | |
| 2009/0043831 A1 * | 2/2009 | Antonopoulos et al. | 707/205 |
| 2009/0073769 A1 * | 3/2009 | Ronen | 365/185.19 |
| 2009/0089482 A1 * | 4/2009 | Traister | 711/103 |
| 2009/0100244 A1 | 4/2009 | Chang et al. | |
| 2009/0327590 A1 * | 12/2009 | Moshayedi | 711/103 |
| 2009/0327591 A1 | 12/2009 | Moshayedi | |
| 2010/0023682 A1 * | 1/2010 | Lee et al. | 711/103 |
| 2010/0082884 A1 * | 4/2010 | Chen et al. | 711/103 |
| 2010/0115192 A1 * | 5/2010 | Lee | 711/103 |
| 2010/0174847 A1 * | 7/2010 | Paley et al. | 711/103 |
| 2010/0246257 A1 | 9/2010 | Ito et al. | |

(Continued)

OTHER PUBLICATIONS

International Search Report issued in corresponding PCT Appln. No. PCT/US2012/070467 dated May 31, 2013 (4 pgs).

(Continued)

*Primary Examiner* — Tuan Thai
*Assistant Examiner* — Edward Waddy, Jr.
(74) *Attorney, Agent, or Firm* — Brinks Gilson & Lione

(57) ABSTRACT

A method and system for SLC-MLC Wear Balancing in a flash memory device is disclosed. The flash memory device includes a single level cell (SLC) portion and a multi-level cell (MLC) portion. The age of the SLC portion and the MLC portion may differ, leading potentially to one portion wearing out before the other. In order to avoid this, a controller is configured to receive an age indicator from one or both of the SLC portion and the MLC portion, determine, based on the age indicator, whether to modify operation of the SLC portion and/or the MLC portion, and in response to determining to modifying operation, modify the operation of the at least one of the SLC portion or the MLC portion. The modification of the operation may thus balance wear between the SLC and MLC portions, thereby potentially extending the life of the flash memory device.

23 Claims, 11 Drawing Sheets

(56) References Cited

U.S. PATENT DOCUMENTS

| | | | |
|---|---|---|---|
| 2011/0271043 A1* | 11/2011 | Segal et al. | 711/103 |
| 2011/0302358 A1* | 12/2011 | Yu et al. | 711/103 |
| 2012/0185638 A1* | 7/2012 | Schreiber et al. | 711/103 |
| 2012/0191664 A1* | 7/2012 | Wakrat et al. | 707/684 |
| 2013/0159362 A1* | 6/2013 | Halpern et al. | 707/823 |
| 2013/0159603 A1* | 6/2013 | Whitney | 711/103 |

OTHER PUBLICATIONS

Written Opinion of the International Searching Authority issued in corresponding PCT Appln. No. PCT/US2012/070467 dated May 31, 2013 (4 pgs).

* cited by examiner

SLC-MLC WEAR BALANCING

TECHNICAL FIELD

This application relates generally to managing data in a memory system. More specifically, this application relates to balancing wear between single level cell memory and multi-level cell memory.

BACKGROUND

Non-volatile memory systems, such as flash memory devices, have been widely adopted for use in consumer products. Flash memory devices may be found in different forms, for example in the form of a portable memory card that can be carried between host devices or as a solid state disk (SSD) embedded in a host device. When writing data to a conventional flash memory device, a host typically writes data to, and reads data from, addresses within a logical address space of the memory system.

The flash memory device includes an array of floating-gate memory cells. The memory cells may be operated to store more than two detectable levels of charge in each charge storage element or region, thereby to store more than one bit of data in each. This configuration is referred to as multi-level cell (MLC) memory. Alternatively, the memory cells may be operated to store two levels of charge so that a single bit of data is stored in each cell. This is typically referred to as a binary or single level cell (SLC) memory.

Both SLC and MLC types of memory cells may be used in a memory device, such that the memory device may include an SLC portion and an MLC portion. Ideally, the SLC portion and the MLC portion will wear out at the same time. However, at times, the SLC portion wears out at a different time than the MLC portion. To correct for this, cells within the MLC portion can be reallocated to be part of the SLC portion, which can compensate for the different wear out times of the SLC portion and the MLC portion. However, it may be difficult to reallocate cells within the SLC portion to be part of the MLC portion. In this way, it is difficult to balance the wear of the SLC portion and the MLC portion.

BRIEF SUMMARY

Methods and systems are disclosed herein for balancing wear between an SLC portion and an MLC portion in a flash memory device.

According to one aspect, a method for managing usage of a SLC portion and a MLC portion in a flash storage device is disclosed. The method includes, in the flash storage device having a controller and a memory in communication with the controller, the memory including the SLC portion and the MLC portion: accessing an age indicator for the flash storage device; determining, based on the age indicator, whether to modify operation of at least one of the SLC portion or the MLC portion; and in response to determining to modify operation of at least one of the SLC portion or the MLC portion, modifying the operation of the at least one of the SLC portion or the MLC portion. The age indicator may include an indication of the chronological age, the wear, the reliability, or the like of the respective portion in the flash memory device. The system controller controls operations in the SLC portion and the MLC portion using various parameters and rules. Based on the age indicator(s), the system controller may modify the parameters and/or rules controlling the operations of the SLC portion and/or MLC portion, thereby modifying the aging of the SLC portion and/or MLC portion.

According to a second aspect, a storage device is disclosed. The storage device includes a memory and a controller. The memory includes a SLC portion and a MLC portion. The controller is in communication with the memory and is configured to: access an age indicator for the flash storage device; determine, based on the age indicator, whether to modify operation of at least one of the SLC portion or the MLC portion; and in response to determining to modify operation of at least one of the SLC portion or the MLC portion, modify the operation of the at least one of the SLC portion or the MLC portion.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

Figure 1:
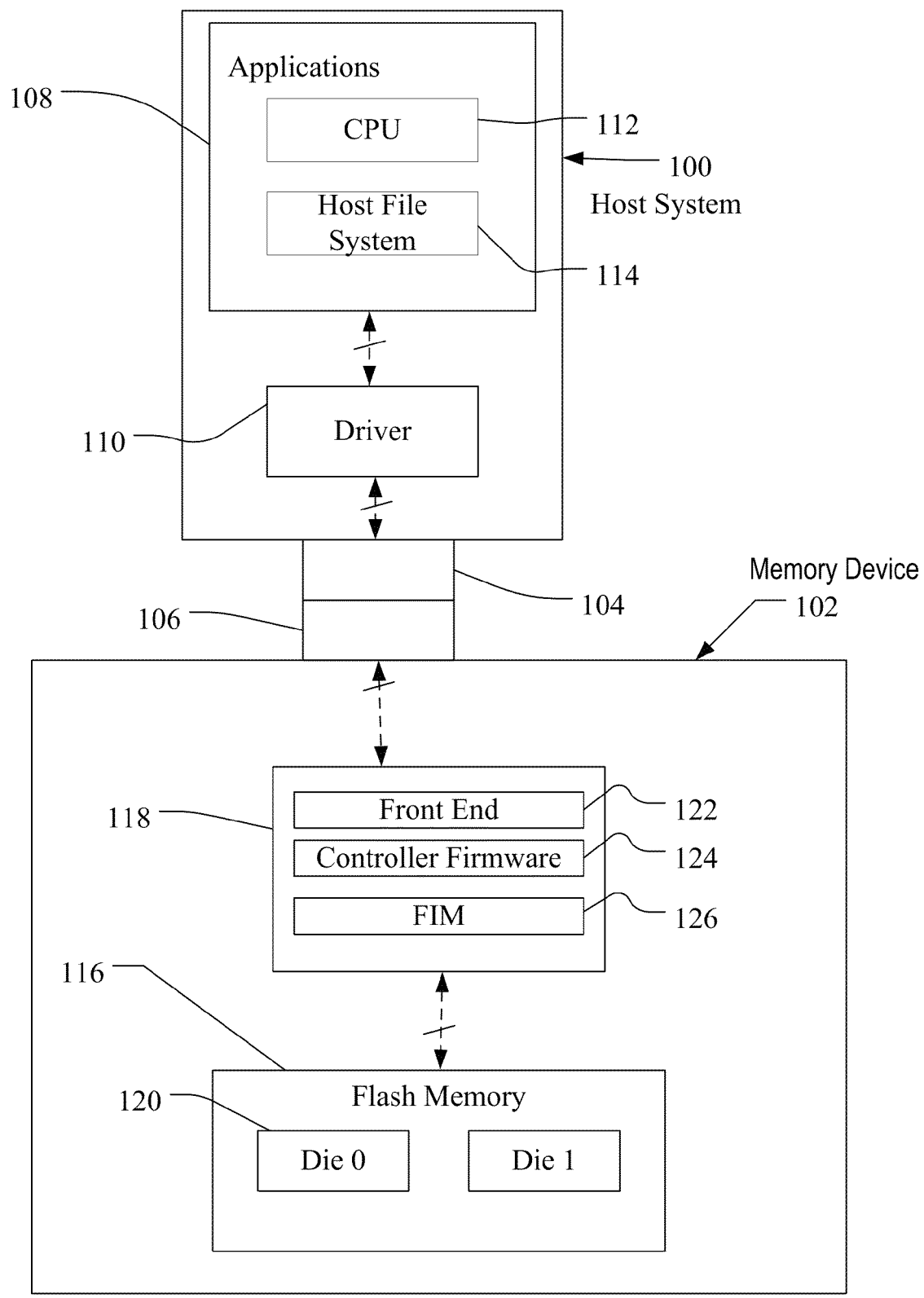
FIG. 1 illustrates a host connected with a memory system having a multi-bank non-volatile memory containing multiple die.
Figure 2:
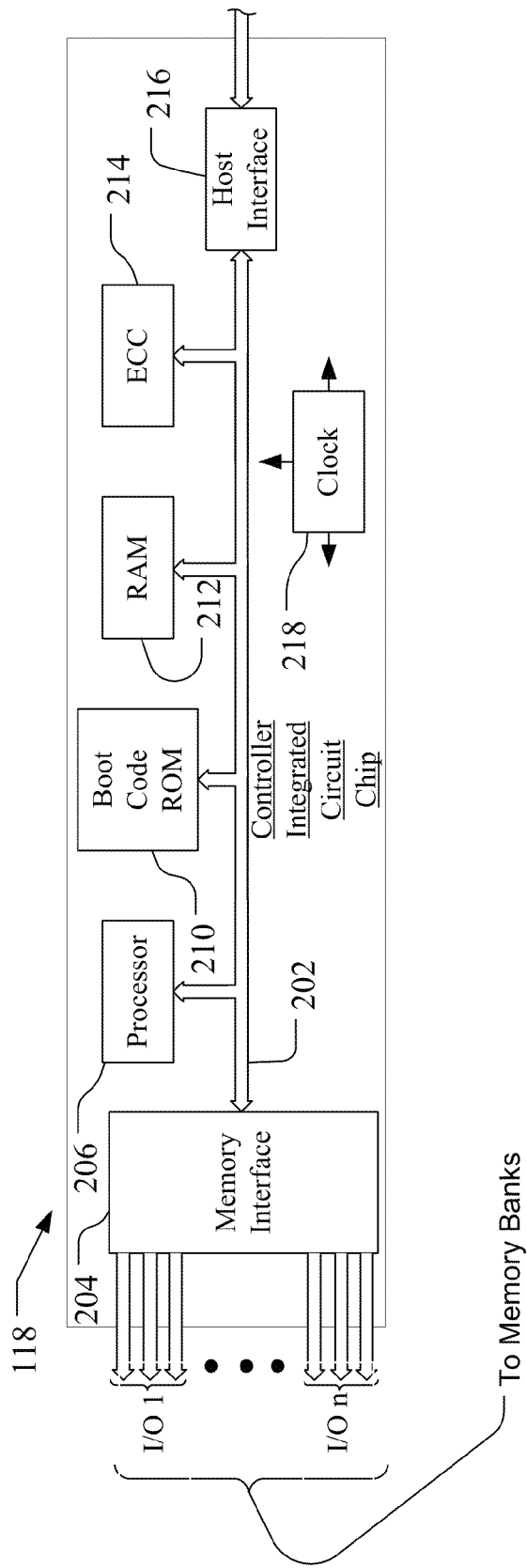
FIG. 2 is an example block diagram of an example flash memory system controller for use in the multiple die non-volatile memory of FIG. 1.

A flash memory device suitable for use in implementing aspects of the invention is shown in FIGS. 1-10. A host system 100 of FIG. 1 stores data into and retrieves data from a memory device 102. The memory device may be flash memory embedded within the host, such as in the form of a solid state disk (SSD) drive installed in a personal computer. Alternatively, the memory device 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory device 102 internal to the host. SSD drives may be in the form of discrete modules that are drop-in replacements for rotating magnetic disk drives.

The host system 100 of FIG. 1 may be viewed as having two major parts, insofar as the memory device 102 is concerned, made up of a combination of circuitry and software. They are an applications portion 108 and a driver portion 110 that interfaces with the memory device 102. In a PC, for example, the applications portion 110 can include a processor 112 running word processing, graphics, control or other popular application software, as well as the file system 114 for managing data on the host system 100. In a camera, cellular telephone or other host system that is primarily dedicated to performing a single set of functions, the applications portion 108 includes the software that operates the camera to take and store pictures, the cellular telephone to make and receive calls, and the like.

The memory device 102 of FIG. 1 may include non-volatile memory, such as flash memory 116, and a system controller 118 that both interfaces with the host system 100 to which the memory device 102 is connected for passing data back and forth and controls the memory 116. The system controller 118 may comprise a microcontroller, a processor, or any other type of device for implementing the functionality and logic described herein (such as the logic described in FIGS. 11-12). The system controller 118 may be implemented on a single integrated circuit chip, such as an application specific integrated circuit (ASIC), a programmable logic array, a logical digital circuit, or other now known or later developed logical processing capability.

The system controller 118 may convert between logical addresses of data used by the host system 100 and physical addresses of the flash memory 116 during data programming and reading. The flash memory 116 may include any number of memory die 120 and two memory die are shown in FIG. 1 simply by way of illustration. Functionally, the system controller 118 may include a front end 122 that interfaces with the host system 100, controller firmware 124 for coordinating operation of the memory 116 for internal memory management operations such as garbage collection, and one or more flash interface modules (FIMs) 126 to provide a communication interface between the system controller 118 with the flash memory 116.

The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
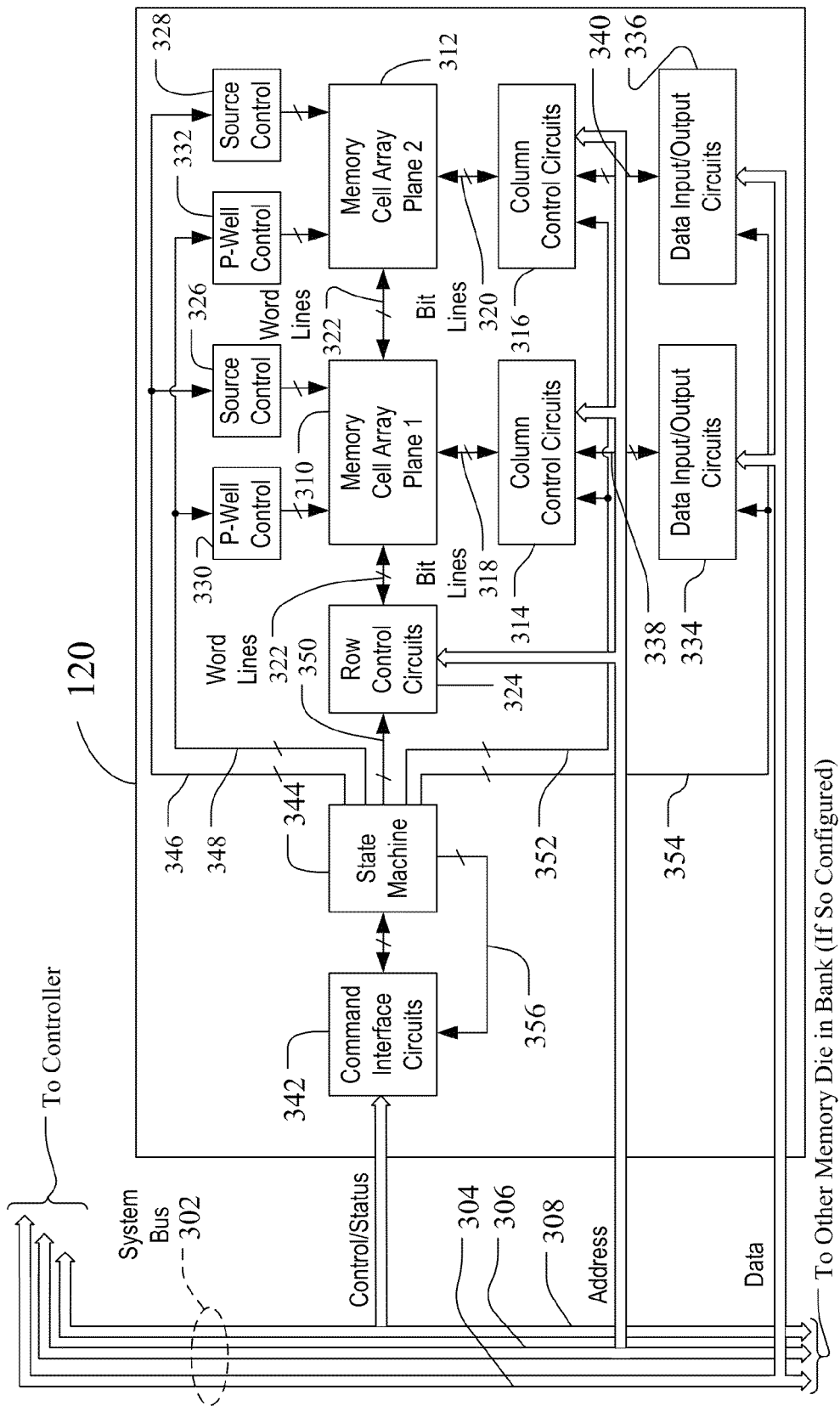
FIG. 3 is an example one flash memory bank suitable as one of the non-volatile memory banks illustrated in FIG. 1.

Each die 120 in the flash memory 116 may contain an array of memory cells organized into multiple planes. FIG. 3 shows one of such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 19. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
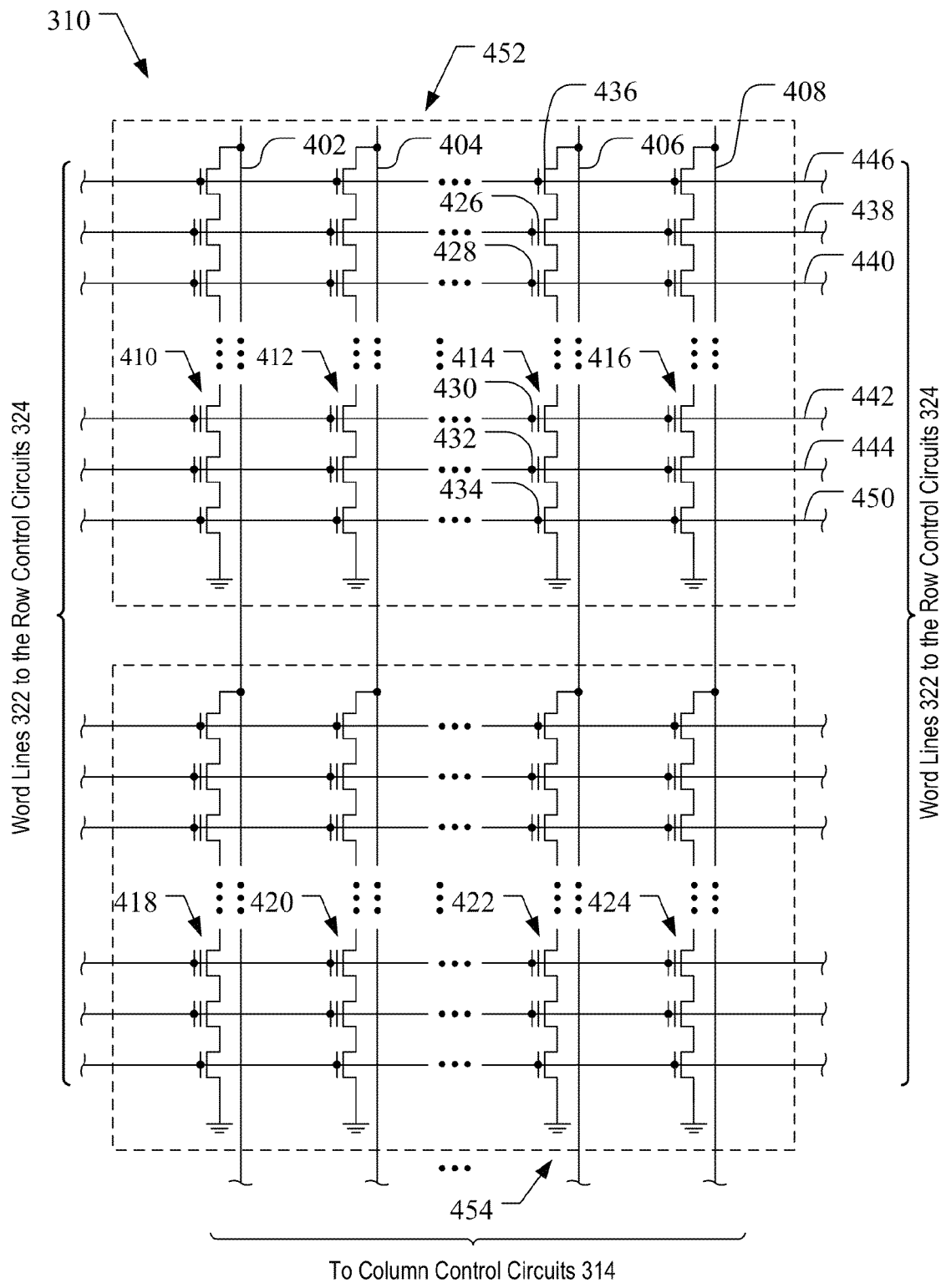
FIG. 4 is a representative circuit diagram of a memory cell array that may be used in the memory bank of FIG. 3.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. The row along the word line 438 is programmed last.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
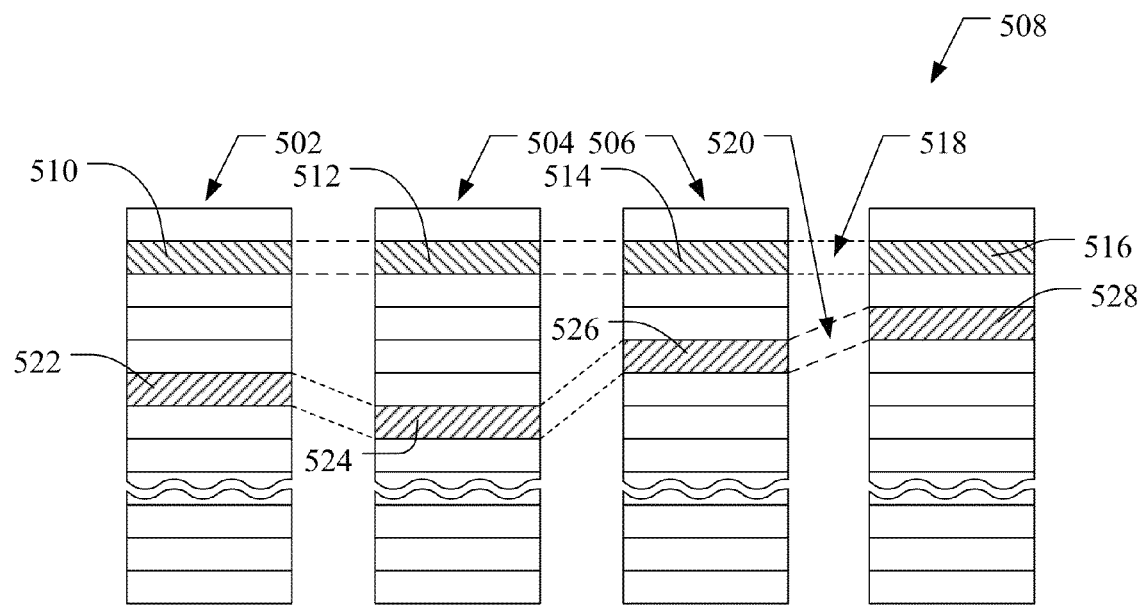
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a meta block are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory device can be operated with the ability to dynamically form metablocks of any or all of one, two or three blocks in different planes. This allows the size of the metablock to be more closely matched with the amount of data available for storage in one programming operation.

Figure 6:
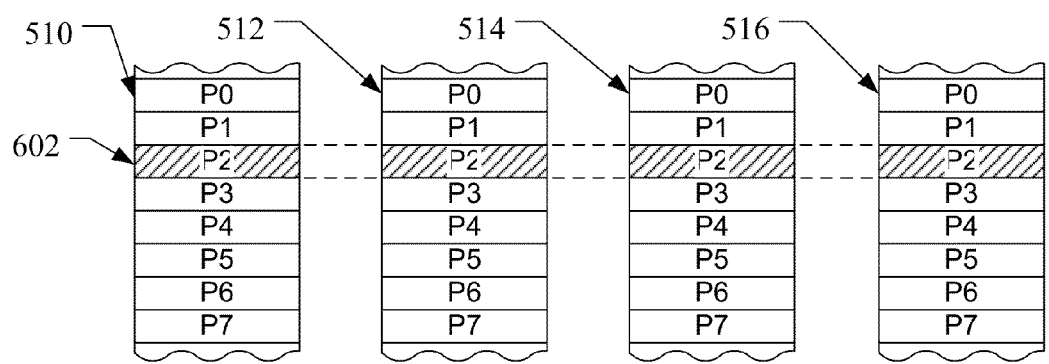
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory device operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a die, a metapage is the maximum unit of programming.

Figure 7:
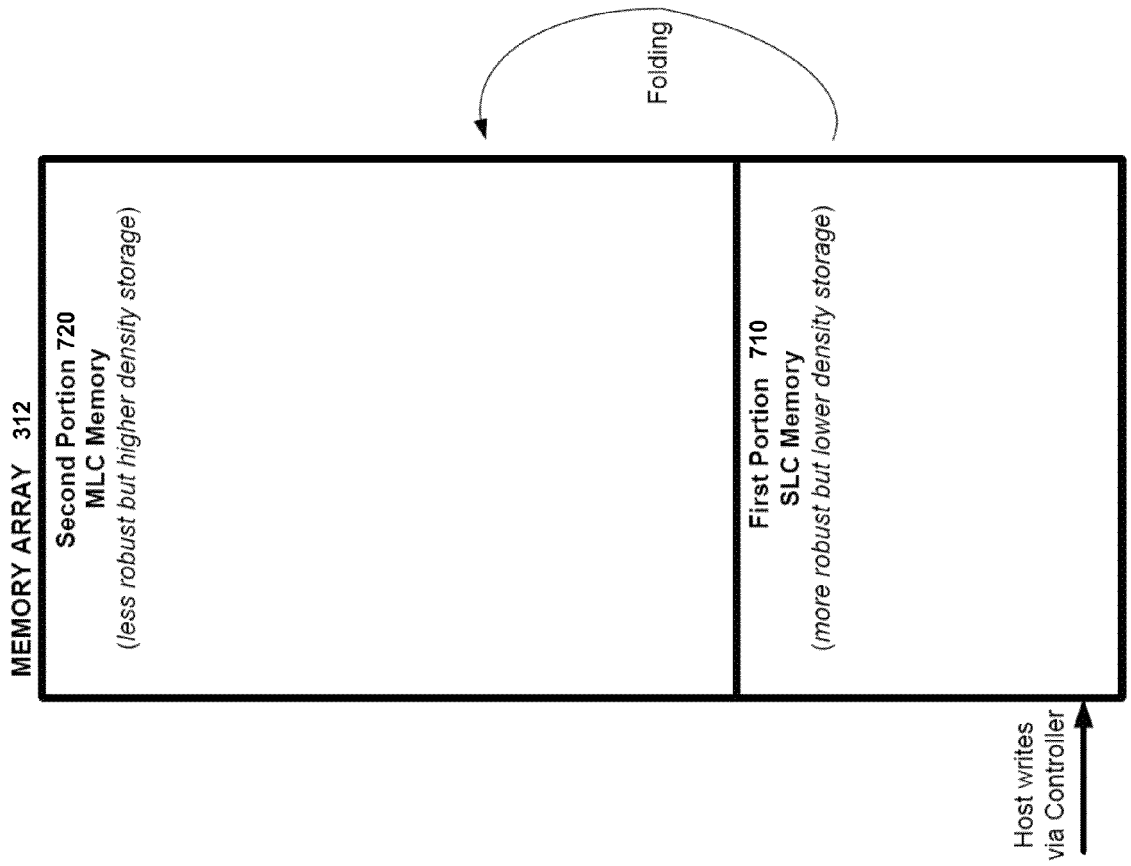
FIG. 7 illustrates an example of a physical memory architecture that includes an SLC portion and an MLC portion.

FIG. 7 illustrates an example of a physical memory architecture. The physical memory architecture is discussed in U.S. Provisional Application No. 61/487,234, incorporated by reference herein in its entirety. The array of memory cells (see, e.g., 310, 312 in FIG. 3) is partitioned into a first portion 710 and a second portion 720. The second portion 720 has the memory cells configured as high density storage with each cell storing multiple bits of data. The first portion 710 has the memory cells configured as lower density storage with each cell storing less number of bits than that of the second portion. For example, memory cells in the first portion 710 are configured as SLC memory to store 1 bit of data each. As one example, memory cells in the second portion 720 are configured as MLC memory to store 2 bits of data each. The first portion storing 1 bit of data per cell will also be referred as D1 and the second portion storing 2 bit of data per cell as D2. The first portion 710 typically operates with more speed, a much wider margin of error and more endurance compared to that of the second portion. Alternatively, memory cells in the second portion 720 are configured as MLC memory to store more than 2 bits each (such as 3 bits). A memory partitioned into two portions such as into D1 (1-bit) and D3 (3-bit) portions is disclosed in U.S. application Ser. No. 12/642,584 filed on Dec. 18, 2009 (published as United States Published Application No. 2011-0153912 A1), the entire disclosure of which is incorporated herein by reference.

Figure 8:
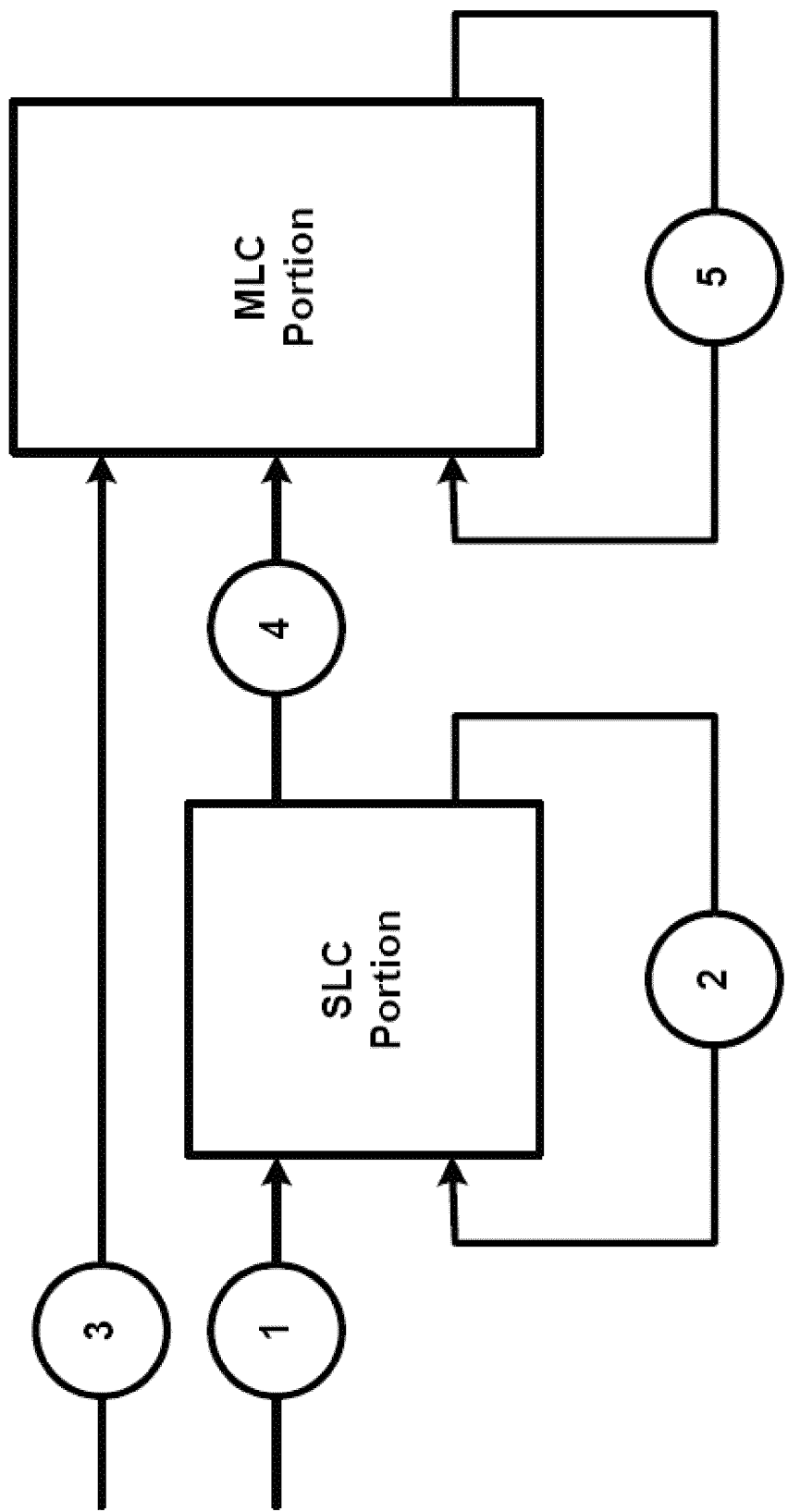
FIG. 8 illustrates schematically the data path between the SLC portion and the MLC portion in a 2-layer data storage system.

As discussed in more detail with respect to FIG. 8, the SLC portion and the MLC portion may be used for various operations. The use of the SLC portion and the MLC portion may age the respective portion. Age for a portion may be characterized as the chronological age, the wear, the reliability, or the like of the respective portion. One indicator is program/erase (P/E) cycles. Typically, a block in the SLC portion or the MLC portion is erased and then programmed by writing data into the cells of the block. Each time a block undergoes a P/E cycle, a counter may be incremented. The number of the counter may thus provide one indicator of the age of the block. As discussed above, each of the SLC portion and the MLC portion may include multiple blocks. P/E cycles may be monitored for each of the blocks in the SLC portion and the MLC portion. Alternatively, the P/E cycles may be monitored for a single block in the SLC portion and a single block in the MLC portion. Due to wear leveling, it may be assumed that the P/E cycle for a single block is likely the P/E cycle for other blocks in the respective portion. Wear leveling arranges data so that erasures and re-writes in the SLC portion and/or the MLC portion are distributed evenly across the blocks. In this way, the blocks in a respective portion typically have the same (or similar) number of P/E cycles.

Alternatively, P/E cycles may be monitored for each logical grouping of blocks (such as monitoring P/E cycles for metablocks, discussed above). As another alternative, P/E cycles for some or all of the blocks in the SLC portion and the MLC portion may be averaged. For example, the average of the P/E cycles for each of the blocks in the respective portion may be used to generate the age indicator of the respective portion.

Other indicators of age include: number of total blocks left (such as the number of blocks in the SLC portion that have not failed or the number of blocks in the MLC portion that have not failed); number of spares left/number of blocks failed (such as the number of blocks in the SLC portion that have failed or the number of blocks in the MLC portion that have failed); ECC based bit error rate (BER); program/erase time; CVD, state shift level. The indicators of age are merely for illustration purposes. Other indicators are contemplated.

FIG. 8 illustrates schematically the data path between the SLC portion and the MLC portion in a 2-layer data storage system. The first layer is the main input buffer for incoming data and operates on the SLC portion of a NAND memory which is faster/higher endurance/higher-cost memory compared to the MLC portion. The second layer is the main data archive storage and operates on the MLC portion which is slower/lower-endurance/lower-cost memory.

Example operations in such system are labeled in FIG. 8 are as follows:

1. Host data or control data write to SLC portion.
2. Data copy within SLC portion to reclaim partially obsolete SLC block, aka 'compaction'.
3. Host data direct write to MLC portion, usually used for long sequential writes.
4. Data move from SLC to MLC portion, aka 'folding'.
5. Data copy within MLC portion for MLC block reclaim, aka 'MLC compaction'.

The operations affect the usage of the SLC portion and the MLC portion, and in turn the age of the respective portion. As discussed in more detail below, each of these operations may be controlled by one or more parameters. So that, modification of the one or more parameters may thus modify the operation, and in turn modifying the aging or the progression of the aging process of the SLC portion and/or the MLC portion, thereby modifying the wear balance between the SLC portion and the MLC portion. The listed operations are merely for illustration purposes only. Different memory systems may have different operations (such as some or all of the operations listed and/or different operations). Further, other operations are contemplated.

Figure 9:
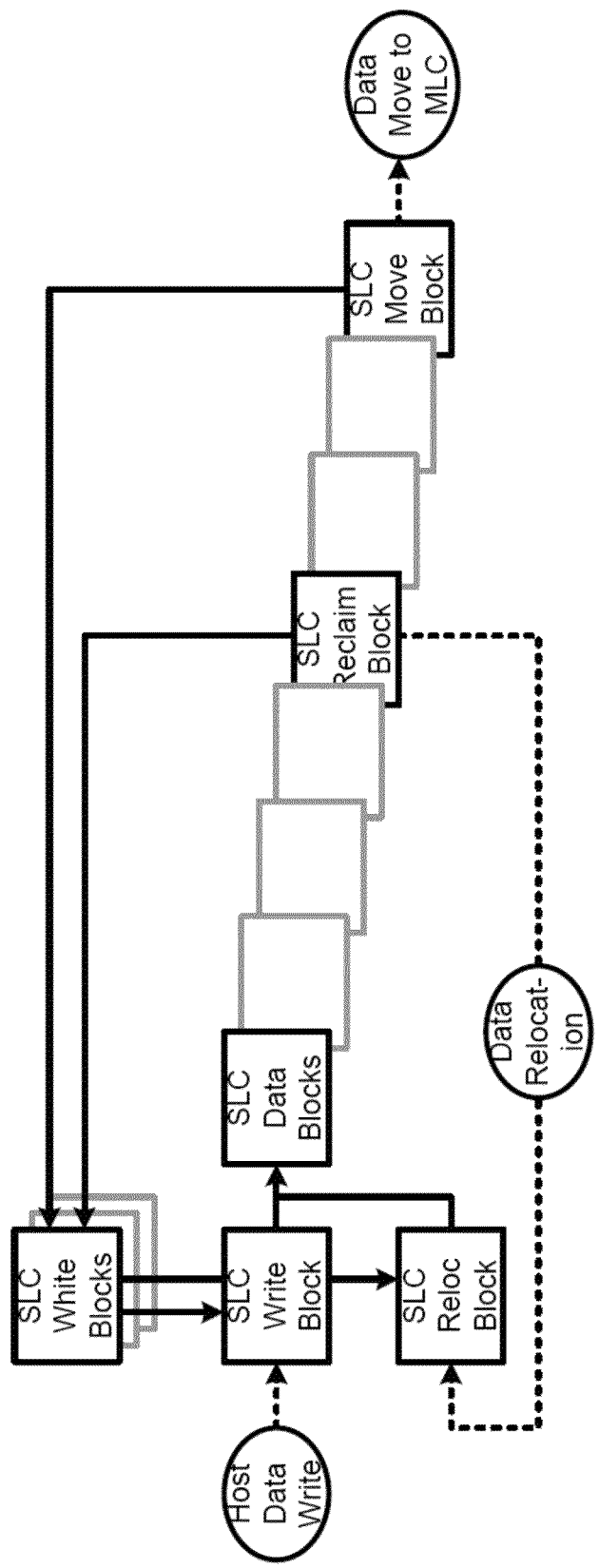
FIG. 9 illustrates in more detail the SLC layer shown in FIG. 8.

FIG. 9 illustrates in more detail the SLC layer shown in FIG. 8. The typical structure of SLC layer uses multiple blocks, usually one Write/Update block data and one Relocation/Compaction block for data copied during block reclaim (or, they can be combined). As discussed above, one or more parameters may dictate various operations within the SLC portion and/or MLC portion. One such operation includes Relocation/Compaction, which may be controlled by the following rules:

1. Blocks are linked in the chain according to the order in which they were programmed.
2. The least recently programmed block is selected as the SLC move/folding block, from which data may be moved/folded to the MLC write block.
3. The block with the lowest volume of valid data is selected as the SLC reclaim block, from which valid data is relocated to the SLC relocation block connecting to the head of the chain.
4. An SLC move block or SLC relocation block is added to the SLC empty block list on completion of a data move/folding or block reclaim operation.

In addition to that, the two-layer structure can be in fact more than two layer, if there are more types of memory, such as RAM, or a third type of non-volatile memory. Further, in each 'memory' layer, there might be multiple sub-systems, with different data handling, which is also referred to as a 'layer'.

Systems based on NAND memory usually have the following storage hierarchy. The SLC partition has SLC blocks to implement a Binary Cache and Binary Update blocks. The Binary Cache is used for some or all data. Data is stored in the Binary Cache with fine granularity of 1 or 8 (4 KB) sectors. Typically, the Binary Cache is used to cache small and random fragments of a page. It may then be evicted to the Binary Update block.

The Binary Update blocks map most of the data in units of Logical Group. Each Logical Group has a size that corresponds to the SLC block. So that, one Binary block can store up to one Logical Group in which the pages are in sequential order of logical address. This layer does not exist in cluster-based systems, as in those systems all Binary blocks are used as Binary Cache.

The MLC partition has MLC blocks for storing the data in higher density than the SLC blocks. Typically, data is stored MLC-block by MLC-block. Thus, for example, in a memory with D1 (1 data bit in a SLC) and D3 partitions (3 data bits in a MLC), 3 SLC blocks are folded (relocated) to 1 MLC block.

Eviction of data from the Binary Cache to the SLC update blocks and to the MLC blocks may be based on one or more criteria (such as a Least-Recently-Written basis). The issue in all systems is that most of the data (with the exception of data updated while in Binary Cache) is going to SLC blocks first so that the SLC blocks work pretty much as a FIFO buffer. Then, all data go to MLC blocks. In both the SLC and MLC portions, the data can be copied many times due to padding (to make a full addressing unit), or to compact blocks and reclaim obsolete space. The Stress Factor (also known as Write Amplification) is high and applies to both SLC and MLC block partitions. The data in SLC is also allocated in MLC (double allocation), which increases the required number of blocks in the system due to doublebudgeting.

Figure 10:
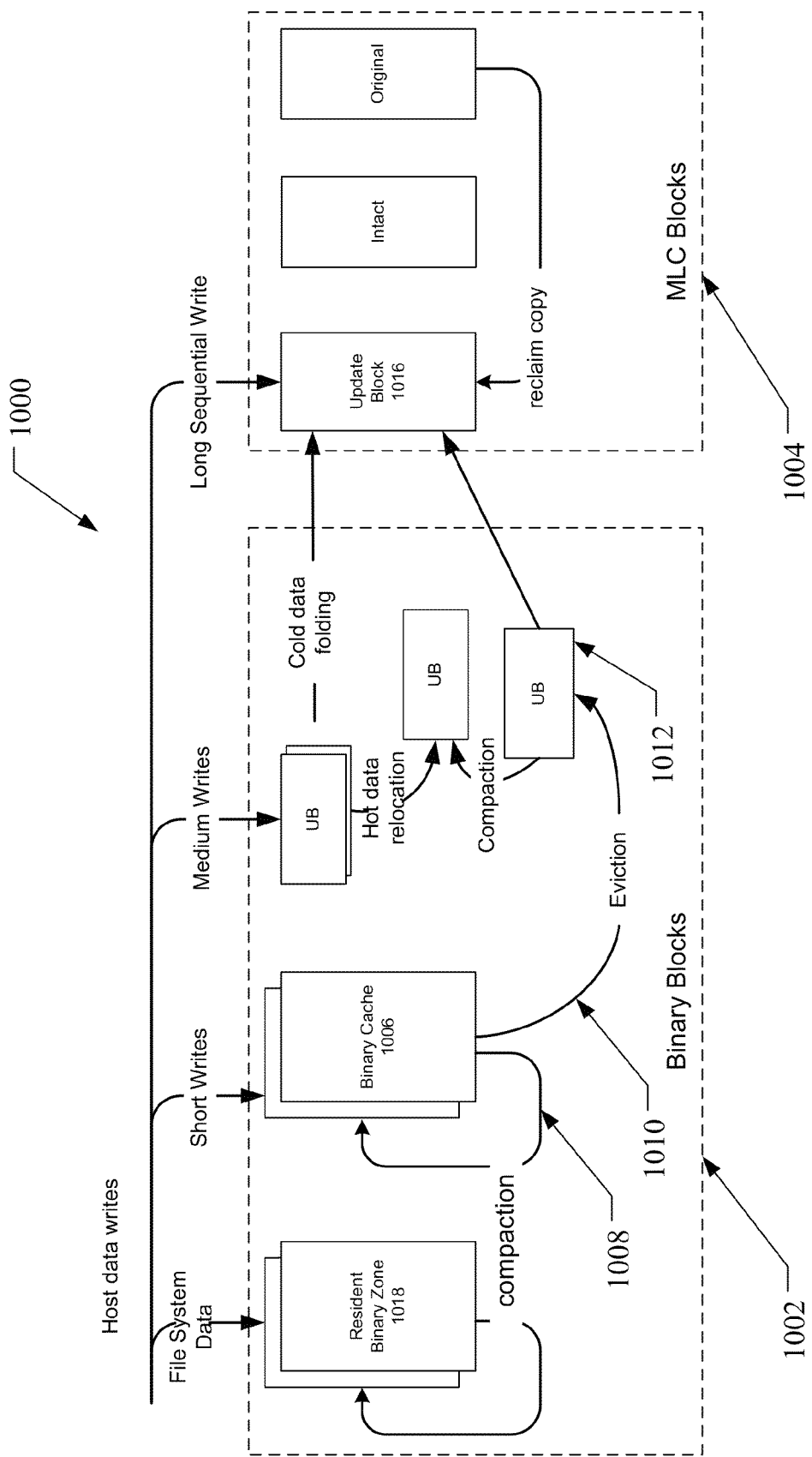
FIG. 10 illustrates a system architecture for managing the blocks and pages across the SLC portion and the MLC portion.

FIG. 10 illustrates a system architecture for managing the blocks and pages across the different memory partitions (such as across the binary blocks 1002 and the MLC blocks 1004). The blocks and pages in the memory arrays are managed by a block management system, which resides as controller firmware 124 in the system controller 118 (see FIG. 1). The amount of host data and/or the type of host data may determine whether the host data is stored in the SLC portion or MLC portion, or where within the SLC portion the host data is stored. In particular, the amount of data may determine whether the host data is stored in binary cache (for smaller amounts of host data), is stored in update blocks in the binary blocks (for medium amounts of host data), or is stored in MLC (for larger amounts of sequential host data). Further, the type of data (such as file system data) may determine where the host data is stored within the binary blocks, as discussed below.

The binary blocks 1002 may be divided into two layers. The first layer is for initially storing data from a host and staging the metapages logical-group by logical-group before relocating each logical group into the second layer of the SLC portion. The first layer includes two structures: a resident binary zone and a binary cache. The system controller 118 may route data less than a predetermined amount, such as small fragments less than a metapage, to the binary cache 1006. In this way, the binary cache 1006 is storage for mainly short fragments with fine addressing unit (sector), where the data can be moved/evicted to SLC or MLC blocks. The binary cache 1006 will be periodically compacted 1008 to clean up stale data. When the binary cache 1006 fills up, a logical group will be selected for eviction 1010. The internal housekeeping function of binary cache eviction copies the logical group to an update block 1012 and schedules it for folding to an MLC update block 1016, as discussed below. The resident binary zone 1018 is reserved for known frequently updated areas with short updates or other logical regions that require frequent updates or faster write performance, typically NTFS, FAT data or other File System table data.

The second layer stores data logical-group by logical-group in a pool of SLC update/storage blocks. The writes to this pool come from host writes or from rewrites due to garbage collection. If the host data is mainly of a short fragment, it may first be cached in the first layer before being evicted from the first layer to the second layer. If the host data is less fragmented (medium size), where complete logical group can be had, it may be written directly to the second layer.

Essentially, the second layer provides a fast SLC storage area where fragmented and medium size host writes land. In this way, the second layer maintains a working set of user data in the fast SLC storage area. Thus, a user may experience high performance writes as the pool of SLC update/storage blocks are being filled. When the pool is full, the system controller 118 may move some logical groups over to the MLC blocks 1004 to make room.

Figure 11:
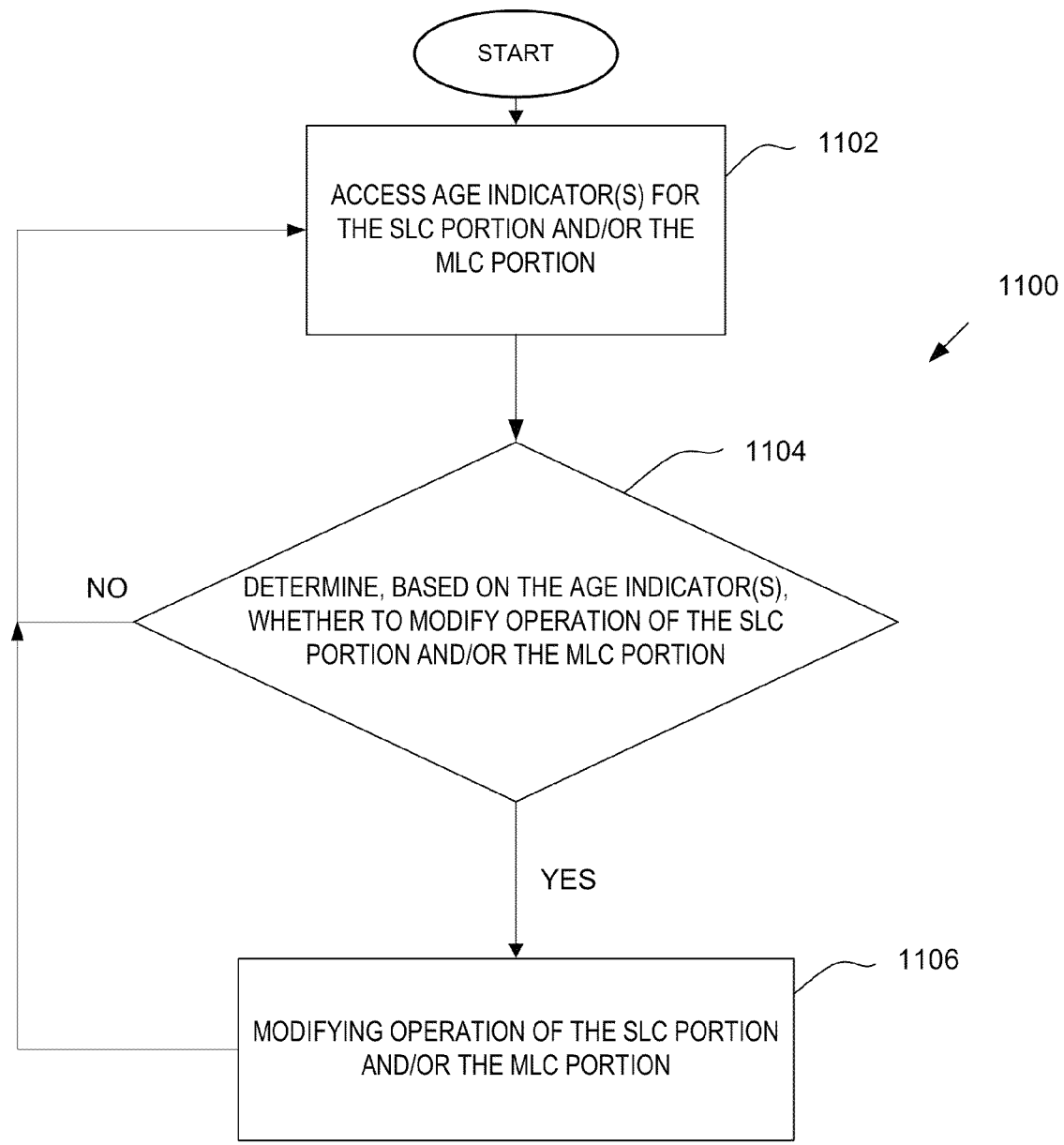
FIG. 11 illustrates a flow chart of SLC-MLC wear balancing.

FIG. 11 illustrates a flow chart 1100 of SLC-MLC wear balancing. At 1102, the system controller 118 may access one or more age indicators for the SLC portion and/or the MLC portion. The age indicators may be stored in one or more places in the flash memory device, such as in non-volatile memory associated with the system controller 118 (see, for example, RAM buffer 212). As discussed above, various age indicators may be used including: P/E cycles; number of total blocks left; number of spares left/number of blocks failed; ECC based bit error rate (BER); program/erase time; CVD, state shift level.

At 1104, the system controller 118 determines, based on the one or more age indicators, whether to modify operation of the SLC portion and/or the MLC portion. The indicators may be compared with a data construct of a preferred or an optimal relationship of SLC wear to MLC wear, and depending on the comparison, determine whether to modify operation of the SLC portion and/or the MLC portion.

The data construct may comprise a table, a graph, or the like. Generally speaking, the data construct may indicate the preferred balance of wear of the SLC portion with the MLC portion at any stage of operation of the memory device. For example, the data construct may predict the best balance curve of wear so that both SLC blocks and MLC blocks achieve a predetermined state (such as the maximum number of P/E cycles at End Of Life for the memory device). In this way, the memory device may achieve an improved endurance level. The data construct may likewise be stored in one or more places in the flash memory device, such as in non-volatile memory associated with the system controller 118 (see, for example, RAM buffer 212).

In one embodiment, the data construct may include data so that the 'wear balancing' (discussed in more detail below) attempts to make the wear for the SLC portion balanced with the MLC portion. For example, the data construct indicating the preferred ratio of wear between the SLC portion and the MLC portion may be a predetermined constant value. As another example, if the data construct is a graph with SLC wear being on one axis and MLC wear being on another axis, the data construct may comprise a straight line, thereby attempting to balance the wear of the SLC portion with the MLC portion during all periods of operation of the memory device. In an alternate embodiment, the data construct may include wear for the SLC portion and the MLC portion that are not balanced. For example, the data construct may comprise a curve or a piece-wise linear function, which may comprise more of optimal wear driving. The curve may account for a memory device that begins with a large pool of blocks and ends with a small pool of blocks. In particular, the number of MLC spare blocks typically gets smaller as the devices ages, thereby increasing the MLC portion stress. So that, the optimal curve may comprise overstressing the SLC portion at the beginning of life of the memory device (which may also provide better performance) more than required to balance the wear of the current SLC versus MLC ratio. In this way, during the earlier operation of the memory device, the MLC portion operates at lower stress and has an extra margin for operation. As the memory device proceeds toward its end-of-life (EOL), when the MLC portion write amplification increases, the wear in both the SLC portion and the MLC portion will converge near EOL point.

As discussed above, the system controller 118 compares the indicators with the data construct. The comparison of the indicators with the data construct may be in one of several forms. As one example, prior to comparison, the indicators may be combined, such as creating a ratio of the SLC age indicator to the MLC indicator. The created ratio may then be compared with the data construct. In particular, when the data construct is a predetermined ratio, the ratio of the SLC age indicator to the MLC age indicator may be compared with the predetermined ratio to determine the amount of deviation of the ratio of the SLC age indicator to the MLC age indicator from the predetermined ratio. Alternatively, one indicator may be input to the data construct, which may then output a preferred value of the other indicator. For example, the SLC age indicator may be input to the data construct, which may then output the preferred MLC age indicator. The preferred age indicator represents the idealized age of the MLC portion for the SLC age indicator input to the data construct. The preferred MLC age indicator may then be compared with the actual MLC age indicator to determine a difference between the two. The examples of the comparisons of the data construct to the age indicators are merely for illustration purposes. Other comparisons are contemplated.

As discussed above, the system controller 118 may determine to modify operation of the SLC portion and/or the MLC portion depending on the comparison. The system controller 118 may modify an operation performed by the memory device that affects only the SLC portion (and thus modifies the wear of the SLC portion), may modify an operation performed by the memory device that affects only the MLC portion (and thus modifies the wear of the MLC portion), or may modify an operation performed by the memory device that affects both the SLC portion and the MLC portion (and thus modifies the wear of both of the SLC portion and the MLC portion). The modification of the operation may likewise affect performance of one or both of the portions.

In particular, the modification of the operation may negatively affect the performance of the memory device. For example, as discussed in more detail below, the system controller may decide to fold data earlier from the SLC portion to the MLC portion, thereby reducing the amount of compaction in the SLC portion (and reducing the wear in the SLC portion); however, the modification may reduce system performance.

For example, the system controller 118 may determine whether to modify operation based on a determined difference between the preferred SLC-MLC wear balance and the actual SLC-MLC wear balance. In the example discussed above whereby the ratio of the SLC age indicator to the MLC age indicator is compared with the predetermined ratio to determine the amount of deviation of the ratio of the SLC age indicator to the MLC age indicator from the predetermined ratio, the amount of deviation may be compared with a predetermined threshold. If the amount of deviation is greater than the predetermined threshold, the system controller 118 may modify the operation of the SLC portion and/or the MLC portion, as discussed in more detail below. In this way, the modification may change the wear balance between the SLC portion and the MLC portion so that wear balance is closer to the preferred wear balance. In the example discussed above whereby the preferred MLC age indicator is compared with the actual MLC age indicator to determine a difference between the two, the difference may be compared with a predetermined amount. If the difference is greater than the predetermined amount, the system controller 118 may modify the operation of the SLC portion and/or the MLC portion.

If the system controller 118 determines to modify the operation of the SLC portion and/or MLC portion, the system controller 118 may modify one or more parameters. The system controller 118 may determine which of the one or more parameters to modify in one of several ways. In one embodiment, the system controller 118 has one predetermined parameter (or a set of predetermined parameters) in which to modify. For example, the controller firmware 124 may have stored therein the parameter(s) to modify. In an alternate embodiment, the system controller may dynamically determine which parameter(s) to modify, as discussed in more detail with respect to FIG. 12. The values of the parameters may be stored in one or more places in the flash memory device, such as in non-volatile memory associated with the system controller 118 (see, for example, RAM buffer 212). Similarly, the modified values of the parameters may be stored in non-volatile memory associated with the system controller 118. The modified values of the parameters may then be used to control future operations in the SLC portion and/or the MLC portion.

At 1106, the system controller 118 may modify parameter(s) that affect the operations discussed above for the SLC portion and/or the MLC portion. After which, the system controller 118 may return to 1102 to iterate. Further, after modification of the parameters, the system controller 118 may access the parameters that control operations of the SLC portion and the MLC portion, and based on the parameters, control the operations of the portions. As one example, the system controller 118 may issue commands that control various operations on the memory die(s) 120 in order to implement the operations of the SLC portion and the MLC portion, as discussed above with respect to FIG. 3. As one example, the system controller 118 may modify the threshold or rule for performing an operation, such as increasing or decreasing the threshold or changing the rule for performing the operation. The effect of the change in the threshold or rule, the system controller may issue different commands to the memory die(s) 120 that affect the operation of the SLC portion and the MLC portion on the memory die(s) 120.

One example of modifying the threshold is the threshold to determine where to write host data, such as the threshold to write in the resident binary zone 1018, the binary cache 1006, the update block in binary blocks, and the update block 1016 in MLC blocks. In particular, the system controller 118 may modify the thresholds defining a "short write", a "medium write" or a "long sequential write", as illustrated in FIG. 10. In this way, the system controller 118 may modify the Open-Ended Write and Sequential by-pass/Direct MLC write thresholds managing the switch to direct write of long sequential writes to the MLC portion.

Another example is to modify the cold data eviction threshold based on the wear on the MLC portion vs. SLC portion. If the SLC portion is being worn more than desired, the cold data eviction threshold may be modified such that more cold data is evicted to MLC portion sooner, thereby reducing the wear on the SLC portion and increasing the wear on the MLC portion. Similarly, if the MLC portion is being worn more than desired, then the cold data eviction threshold may be modified so that the amount of cold data maintained in the SLC portion is increased, thereby increasing wear to the SLC portion and decreasing the wear to the MLC portion.

Yet another example is to modify the Binary Working Set fullness threshold, which is the number of blocks at the disposal of the system controller 118. The number of blocks is adjustable, thereby affecting the operation of the respective portion. Similar, the threshold for triggering the folding operation, see FIG. 10, may be adjusted to affect the use of the SLC portion and the MLC portion.

Still other examples for the system controller 118 to modify include: thresholds and/or rules managing Hot/Cold data sorting and/or data flow between hot/cold data and compaction streams; thresholds and/or rules for managing Hot/Cold data sorting and/or data flow to/from the Resident Binary Zone 1018; Binary Cache write threshold, distributing data flow between Binary Cache and Update Blocks; the Binary Cache Eviction threshold; BC size versus UB/BWS pool size; Binary Cache eviction to MLC versus SLC; and idle time pre-emptive Garbage Collection operation depth. The examples to modify are merely for illustration purposes. Other ways in which to modify the operation of the SLC portion and/or the MLC portion are contemplated.

Figure 12:
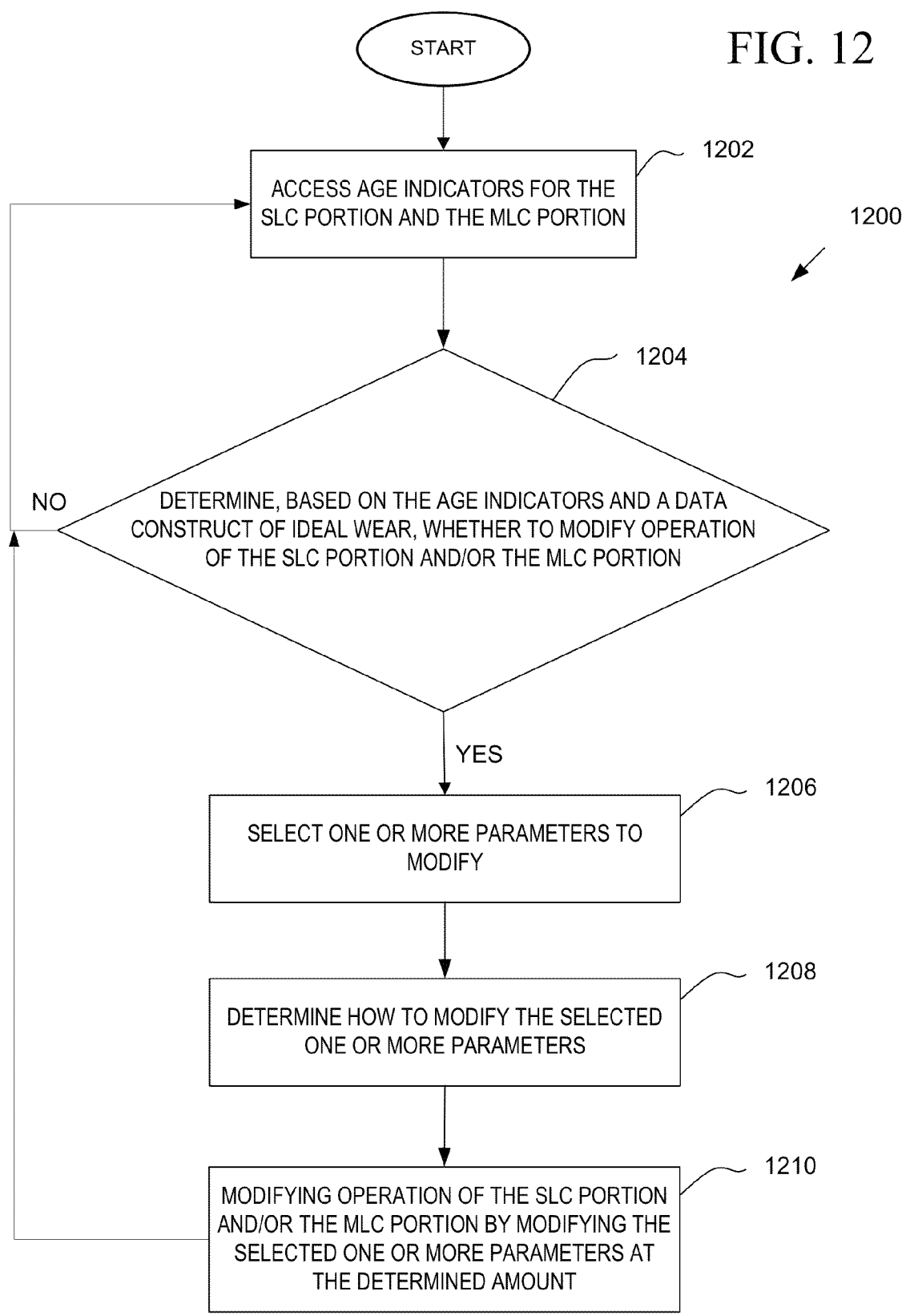
FIG. 12 illustrates another flow chart of SLC-MLC wear balancing.

FIG. 12 illustrates another flow chart 1200 of SLC-MLC wear balancing. At 1202, the system controller 118 accesses both the age indicator for the SLC portion and age indicator for the MLC portion. At 1204, the system controller 118 uses the age indicators for the SLC portion and the MLC portion and the data construct of ideal wear balance between the SLC portion and the MLC portion to determine whether to modify operation of the SLC portion and/or the MLC portion. As discussed above, the indicators may be compared with the data construct of a preferred or an optimal relationship of SLC wear to MLC wear, and depending on the comparison, determine to modify operation of the SLC portion and/or the MLC portion.

If it is determined to modify operation of the SLC portion and/or the MLC portion, at 1206, the system controller 118 selects one or more parameters to modify. As discussed above, a particular memory device has operations performed for the SLC portion and/or the MLC portion. The operations may be controlled by parameters. The system controller 118 may select one or more parameters to change. The selection of the one or more parameters to modify may be static, such as independent of the age indicator of the SLC portion and/or the MLC portion. For example, after the system controller 118 determines to modify operation, the system controller 118 may access one or more parameters that are pre-programmed to be modified, as discussed above. Alternatively, the selection of the one or more parameters to modify may be dynamic. For example, the selection of the one or more parameters to modify may be based on the age indicator of the SLC portion and/or the MLC portion.

At 1208, the system controller 118 then determines how to modify the one or more parameters selected. Each of the one or more parameters selected may have associated with it a range of potential modifications. The determination how to modify the selected parameter may be based on one or more factors, such as the current SLC-MLC wear balance or the deviation of the current SLC-MLC wear balance from the ideal SLC-MLC wear balance. At 1210, the system controller 118 modifies operation of the SLC portion and/or the MLC portion using the determined modifications of the selected parameters.

Accordingly, the method and system may be realized in hardware, software, or a combination of hardware and software. The method and system may be realized in a centralized fashion in at least one electronic device (such as illustrated in flash memory device 102 in FIG. 1) or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

What is claimed is:

1. A method for managing usage of a single level cell (SLC) portion and a multi-level cell (MLC) portion in a storage device, the method comprising:
   in the storage device having a controller and a memory in communication with the controller, the memory including the SLC portion and the MLC portion:
   accessing a current SLC-MLC wear balance for the storage device;
   determining, based on the current SLC-MLC wear balance, whether to change a value of a parameter, the value of the parameter used to determine whether to perform an operation on at least one of the SLC portion or the MLC portion;
   in response to determining to change the value of the parameter, selecting a new value for the parameter, the new value being different from the value of the parameter and being selected based on the current SLC-MLC wear balance for the storage device;
   changing the value of the parameter to the new value; and
   after changing the value of the parameter, using the new value of the parameter to determine whether to perform the operation on the at least one of the SLC portion or the MLC portion.

2. The method of claim 1, wherein the storage device comprises a flash storage device;
   further comprising:
   accessing a current SLC age indicator indicative of age of at least a part of the SLC portion;
   accessing a current MLC age indicator indicative of age of at least a part of the MLC portion; and
   determining the current SLC-MLC wear balance based on the current SLC age indicator and the current MLC age indicator.

3. The method of claim 1, wherein the parameter comprises a threshold for cold data eviction from the SLC portion to the MLC portion.

4. The method of claim 1, wherein the operation comprises determining whether to perform an action in the SLC portion or in the MLC portion;
   wherein determining whether to perform the action in the SLC portion or in the MLC portion is dependent on the value of the parameter; and
   wherein changing the value of the parameter changes the determination whether to perform the action in the SLC portion or in the MLC portion.

5. The method of claim 4, wherein the action comprises writing host data;
   wherein determining whether to write the host data into the SLC portion or the MLC portion is dependent on the value of the parameter; and
   wherein changing the value of the parameter changes the determination whether the host data is written into the SLC portion or into the MLC portion.

6. The method of claim 1, wherein the operation comprises determining where, within the SLC portion, to write host data;
   wherein determining where, within the SLC portion, to write the host data is dependent on the value of the parameter; and
   wherein changing the value of the parameter changes the determination where, within the SLC portion, to write the host data.

7. The method of claim 6, wherein the SLC portion comprises a binary cache and one or more update blocks; and
   wherein changing the value of the parameter changes the determination whether to store the host data in the binary cache or in the one or more update blocks.

8. The method of claim 1, wherein the operation comprises folding data from the SLC portion to the MLC portion;
   wherein determining whether to fold the data from the SLC portion to the MLC portion is dependent on the value of the parameter; and
   wherein, in response to determining to reduce wear on the SLC portion, the parameter is changed in order to fold the data from the SLC portion to the MLC portion earlier.

9. The method of claim 1, wherein the operation comprises evicting cold data from the SLC portion to the MLC portion;
   wherein determining whether to evict the cold data from the SLC portion to the MLC portion is dependent on the value of the parameter;
   wherein, in response to determining to reduce wear on the SLC portion, the parameter is changed in order to evict more of the cold data from the SLC portion to the MLC portion sooner; and
   wherein, in response to determining to reduce wear on the MLC portion, the parameter is changed in order to maintain more of the cold data in the SLC portion.

10. The method of claim 1, wherein the parameter has an associated plurality of potential modifications; and
    wherein selecting the new value for the parameter comprises selecting, based on the current SLC-MLC wear balance, one of the plurality of potential modifications.

11. The method of claim 1, wherein selecting the new value of the parameter is based on a deviation of the current SLC-MLC wear balance from a preferred SLC-MLC wear balance.

12. The method of claim 1, wherein determining, based on the current SLC-MLC wear balance, whether to change the value of the parameter comprises:
    dynamically selecting which parameter, from a plurality of potential parameters, to change based on the current SLC-MLC wear balance.

13. A storage device comprising:
a memory including a single level cell (SLC) portion and a multi-level cell (MLC) portion; and
a controller in communication with the memory, the controller configured to:
access a current SLC-MLC wear balance for the storage device;
determine, based on the current SLC-MLC wear balance, whether to change a value of a parameter, the value of the parameter used to determine whether to perform an operation on at least one of the SLC portion or the MLC portion;
in response to determining to change the value of the parameter, select a new value for the parameter, the new value being different from the value of the parameter and being selected based on the current SLC-MLC wear balance for the storage device;
change the value of the parameter to the new value; and
after changing the value of the parameter, use the new value of the parameter to determine whether to perform the operation on the at least one of the SLC portion or the MLC portion.

14. The storage device of claim 13, wherein the storage device comprises a flash storage device;
wherein the controller is further configured to:
access a current SLC age indicator indicative of age of at least a part of the SLC portion;
access a current MLC age indicator indicative of age of at least a part of the MLC portion; and
determine the current SLC-MLC wear balance based on the current SLC age indicator and the current MLC age indicator.

15. The storage device of claim 13, wherein the parameter comprises a threshold for cold data eviction from the SLC portion to the MLC portion.

16. The storage device of claim 13, wherein the operation comprises determining whether to perform an action in the SLC portion or in the MLC portion;
wherein the controller is configured to determine whether to perform the action in the SLC portion or in the MLC portion based on the value of the parameter; and
wherein the controller is configured to change the value of the parameter in order to change the determination whether to perform the action in the SLC portion or in the MLC portion.

17. The storage device of claim 16, wherein the action comprises writing host data;
wherein the controller is configured to determine whether to write the host data into the SLC portion or the MLC portion based on the value of the parameter; and
wherein the controller is configured to change the value of the parameter in order to change the determination whether to write the host data into the SLC portion or into the MLC portion.

18. The storage device of claim 13, wherein the operation comprises determining where, within the SLC portion, to write host data;
wherein the controller is configured to determine where, within the SLC portion, to write the host data is dependent on the value of the parameter; and
wherein the controller is configured to change the value of the parameter in order to change the determination where, within the SLC portion, to write the host data.

19. The storage device of claim 18, wherein the SLC portion comprises a binary cache and one or more update blocks; and
wherein the controller is configured to change the value of the parameter in order to change the determination whether to store the host data in the binary cache or in the one or more update blocks.

20. The storage device of claim 13, wherein the operation comprises folding data from the SLC portion to the MLC portion;
wherein the controller is configured to determine whether to fold the data from the SLC portion to the MLC portion based on the value of the parameter; and
wherein, in response to determining to reduce wear on the SLC portion, the controller is configured to change the parameter in order to fold the data from the SLC portion to the MLC portion earlier.

21. The storage device of claim 13, wherein the operation comprises evicting cold data from the SLC portion to the MLC portion;
wherein the controller is configured to determine whether to evict the cold data from the SLC portion to the MLC portion based on the value of the parameter;
wherein, in response to determining to reduce wear on the SLC portion, the controller is configured to change the parameter in order to evict more of the cold data from the SLC portion to the MLC portion sooner; and
wherein, in response to determining to reduce wear on the MLC portion, the controller is configured to change the parameter in order to maintain more of the cold data in the SLC portion.

22. The storage device of claim 13, wherein the parameter has an associated plurality of potential modifications; and
wherein the controller is configured to select the new value for the parameter by selecting, based on the current SLC-MLC wear balance, one of the plurality of potential modifications.

23. The storage device of claim 13, wherein the controller is configured to select the new value of the parameter based on a deviation of the current SLC-MLC wear balance from a preferred SLC-MLC wear balance.

* * * * *